(12) United States Patent
Thokachichu et al.

(10) Patent No.: US 11,569,072 B2
(45) Date of Patent: Jan. 31, 2023

(54) RF GROUNDING CONFIGURATION FOR PEDESTALS

(71) Applicant: Applied Materials, Inc., Santa Clara, CA (US)

(72) Inventors: Satya Thokachichu, San Jose, CA (US); Edward P. Hammond, IV, Hillsborough, CA (US); Viren Kalsekar, Sunnyvale, CA (US); Zheng John Ye, Santa Clara, CA (US); Abdul Aziz Khaja, San Jose, CA (US); Vinay K. Prabhakar, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 363 days.

(21) Appl. No.: 16/391,996

(22) Filed: Apr. 23, 2019

(65) Prior Publication Data

US 2019/0341232 A1    Nov. 7, 2019

Related U.S. Application Data

(60) Provisional application No. 62/666,418, filed on May 3, 2018.

(51) Int. Cl.
*H01J 37/32* (2006.01)
*H01L 21/683* (2006.01)
(Continued)

(52) U.S. Cl.
CPC ........ *H01J 37/32715* (2013.01); *C23C 16/46* (2013.01); *C23C 16/509* (2013.01);
(Continued)

(58) Field of Classification Search
USPC .................. 156/345.47; 118/723 e
See application file for complete search history.

(56) References Cited

U.S. PATENT DOCUMENTS 6,063,234 A * 5/2000 Chen .................. G01K 7/00
374/161
7,312,162 B2 12/2007 Ramaswamy et al.
(Continued)

FOREIGN PATENT DOCUMENTS

WO    2005/087974 A2    9/2005

OTHER PUBLICATIONS

Drawing by the Examiner to demonstrate electrical equivalence between the Fig 1 and Jankiraman. Year 2022.*
(Continued)

*Primary Examiner* — Ram N Kackar
(74) *Attorney, Agent, or Firm* — Patterson + Sheridan, LLP

(57) ABSTRACT

Embodiments of the present disclosure generally relate to substrate supports for process chambers and RF grounding configurations for use therewith. Methods of grounding RF current are also described. A chamber body at least partially defines a process volume therein. A first electrode is disposed in the process volume. A pedestal is disposed opposite the first electrode. A second electrode is disposed in the pedestal. An RF filter is coupled to the second electrode through a conductive rod. The RF filter includes a first capacitor coupled to the conductive rod and to ground. The RF filter also includes a first inductor coupled to a feedthrough box. The feedthrough box includes a second capacitor and a second inductor coupled in series. A direct current (DC) power supply for the second electrode is coupled between the second capacitor and the second inductor.

19 Claims, 3 Drawing Sheets

(51) Int. Cl.
  C23C 16/46    (2006.01)
  C23C 16/509   (2006.01)
  H01L 21/02    (2006.01)
  H01L 21/285   (2006.01)

(52) U.S. Cl.
  CPC .. *H01J 37/32082* (2013.01); *H01J 37/32091* (2013.01); *H01J 37/32724* (2013.01); *H01L 21/02274* (2013.01); *H01L 21/02636* (2013.01); *H01L 21/28506* (2013.01); *H01L 21/6831* (2013.01); *H01J 2237/2007* (2013.01); *H01J 2237/332* (2013.01)

(56) References Cited

U.S. PATENT DOCUMENTS

| | | |
|---|---|---|
| 7,790,634 B2 | 9/2010 | Munro et al. |
| 10,125,422 B2 | 11/2018 | Chen et al. |
| 2003/0037881 A1* | 2/2003 | Barnes ................ H01J 37/3244 156/345.44 |
| 2006/0219169 A1 | 10/2006 | Chen et al. |
| 2007/0032054 A1 | 2/2007 | Ramaswamy et al. |
| 2009/0053836 A1 | 2/2009 | Pipitone et al. |
| 2009/0236214 A1* | 9/2009 | Janakiraman ....... C23C 16/5096 204/164 |
| 2013/0210199 A1 | 8/2013 | Chen et al. |
| 2014/0034612 A1 | 2/2014 | Yang et al. |
| 2014/0290576 A1 | 10/2014 | Chen et al. |
| 2015/0024515 A1 | 1/2015 | Hoffman et al. |
| 2015/0235809 A1* | 8/2015 | Ito ............................ H05H 1/46 156/345.48 |
| 2017/0069464 A1 | 3/2017 | Ye et al. |
| 2017/0162417 A1 | 6/2017 | Ye et al. |
| 2018/0158709 A1* | 6/2018 | Tsuji ................. H01J 37/32532 |
| 2018/0358222 A1 | 12/2018 | Venkatasubramanian et al. |

OTHER PUBLICATIONS

International Search Report and Written Opinion dated Sep. 5, 2019 for Application No. PCT/US2019/028665.

* cited by examiner

RF GROUNDING CONFIGURATION FOR PEDESTALS

CROSS-REFERENCE TO RELATED APPLICATIONS

This application claims priority to U.S. Provisional Patent Application No. 62/666,418, filed May 3, 2018, which is herein incorporated by reference.

BACKGROUND

Field

Embodiments of the present disclosure generally relate to substrate supports for processing chambers, and RF grounding configurations for use therewith.

Description of the Related Art

Radio Frequency (RF) power is used in the processing of substrates, such as semiconductor substrates, for plasma generation, electrostatic chucking, and the like. In some processing systems, RF power is supplied to a first electrode and is transferred to a second electrode, such as the substrate support, via capacitive coupling. The second electrode is coupled via an electrical connection to a power supply, allowing the RF power to return to the source, thus completing the RF circuit.

In conventional configurations, RF straps facilitate flow of RF power through an RF filter to an RF cable. High RF current and long processing times result in excessive heating of the RF cable, leading to parts degradation or arcing.

Therefore, there is a need for improved RF grounding configurations.

SUMMARY

In one embodiment, an apparatus is provided which includes a chamber body at least partially defining a process volume therein. A pedestal is disposed in the process volume. A first electrode is disposed in the process volume opposite the pedestal. A second electrode is disposed in the pedestal. A conductive rod is coupled to the second electrode. A radio frequency (RF) filter includes a first capacitor coupled to the conductive rod and coupled to the ground. The RF filter also includes an LC resonant circuit coupled to the conductive rod and a second capacitor coupled to the LC resonant circuit and coupled to ground.

In another embodiment, an apparatus is provided which includes a chamber body at least partially defining a process volume therein. A pedestal is disposed in the process volume. A first electrode is disposed in the process volume opposite the pedestal. A second electrode is disposed in the pedestal. A conductive rod is coupled to the second electrode. An RF filter is coupled to the conductive rod. The RF filter includes a first capacitor coupled to the conductive rod and a first inductor coupled to the conductive rod. A feedthrough box includes a second inductor and a second capacitor coupled in series. A power supply coupled to the second electrode through the feedthrough box and the RF filter.

In yet another embodiment, an apparatus is provided which includes a chamber body at least partially defining a process volume therein. A pedestal is disposed in the process volume. The pedestal includes a substrate support and a shaft coupled to the chamber body to support the substrate support. A first electrode is disposed in the process volume opposite the pedestal. A second electrode is disposed in the pedestal. A conductive rod extends through the shaft of the pedestal and is coupled to the second electrode. An RF filter is disposed in an enclosure and coupled to the conductive rod. The RF filter includes a first capacitor coupled to the conductive rod and coupled to the enclosure and a first inductor coupled to the conductive rod. A feedthrough box includes a second inductor and a second capacitor coupled in series. A cable is coupled to the first inductor and coupled to the second inductor. A power supply is coupled to the second electrode through the feedthrough box and the RF filter. The power supply is coupled between the second inductor and the second capacitor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to substrate supports for process chambers, and RF grounding configurations for use therewith. Methods of grounding RF current are also described. A chamber body at least partially defines a process volume therein. A first electrode is disposed in the process volume. A pedestal is disposed opposite the first electrode. A second electrode is disposed in the pedestal. An RF filter is coupled to the second electrode through a conductive rod. The RF filter includes a first capacitor coupled to the conductive rod and to ground. The RF filter also includes a first inductor coupled to a feedthrough box. The feedthrough box includes a second capacitor and a second inductor coupled in series. A direct current (DC) power supply for the second electrode is coupled between the second capacitor and the second inductor.

Figure 1:
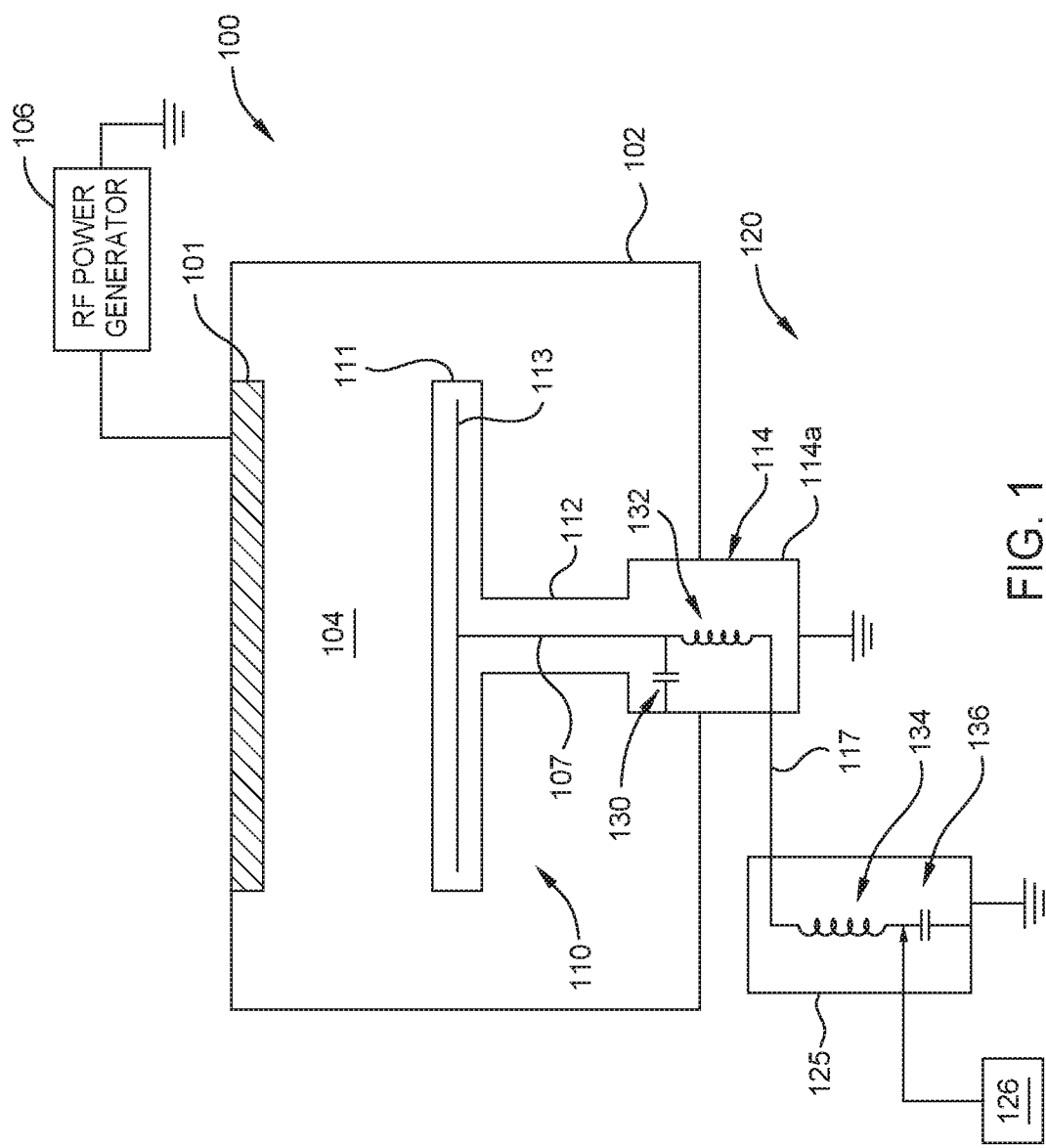
FIG. 1 illustrates a process chamber, according to one aspect of the disclosure.

FIG. 1 illustrates a process chamber 100 according to one embodiment of the disclosure. The process chamber 100 includes a chamber body 102 at least partially defining a process volume 104 therein. A pedestal 110 is disposed in the process volume 104. An RF grounding configuration 120 is coupled to the pedestal 110. An electrode 101, such as a showerhead, is disposed opposite the pedestal 110. An RF power source 106 is coupled to the electrode 101, to facilitate plasma generation within the process chamber 100. Power from the RF power source 106 is capacitively coupled to the pedestal 110 during processing.

The pedestal 110 includes a substrate support 111 disposed at an upper end of a support shaft 112. The substrate support 111 is formed of a ceramic material, such as aluminum nitride, while the support shaft 112 is formed of a metal, such as aluminum, or a ceramic, such as aluminum nitride. A resistive heating element (not shown) may optionally be disposed in the substrate support 111 to facilitate temperature adjustment of the substrate support 111. An electrode 113, such as an RF mesh, is disposed in the substrate support 111 to facilitate plasma generation within the process chamber 100. A conductive rod 107 (e.g., an RF rod) is coupled to the electrode 113 and extends through the shaft 112 to an RF filter 114. The RF filter 114 may be configured as a pass filter (e.g., passing desired RF frequencies therethrough while blocking undesired frequencies), may be configured as a blocking filter (e.g., configured to restrict or prohibit RF energy conducted through a plasma from exiting a process chamber), or may be configured to combine RF and DC power on a single electrode, such as the electrode 113 or another electrode within the pedestal 110.

The RF filter 114 includes a first capacitor 130 and a first inductor 132 disposed therein. The first capacitor 130 is disposed between and electrically connects the RF rod 107 to an electrically-conductive housing 114a of the RF filter 114. In such a way, RF current conducted by the RF rod 107 is conducted through the first capacitor 130, to the electrically conductive (e.g., grounded) housing 114a, and then to internal surfaces of the electrically conductive (e.g., grounded) chamber body 102 of the process chamber 100. RF current may then return to a ground of the RF power generator 106. The first inductor 132 is coupled in series between the electrode 113 and an RF cable 117. The first inductor 132 facilitates blocking of residual RF current flow through the RF cable 117. In one example, the RF current at 13.56 MHz through the RF filter 114 is around 2.5 A (rms) in the RF grounding configuration 120.

The combination of the first capacitor 130 and the first inductor 132 reduce RF current flow through the RF cable 117 compared to conventional approaches, by directing RF power current flow to internal surfaces of the chamber body 102. In one example, RF power current flow through the RF cable 117 is reduced approximately 90 percent (%) compared to conventional approaches. Thus, arcing and component degradation in the process chamber 100 are reduced. Additionally, in embodiments disclosed herein, the RF cable 117 carries less than 3 A (rms), resulting in the RF cable operating at a cooler temperature compared to conventional approaches. Because the RF cable 117 operates at cooler temperatures, inadvertent or undesired solder reflow of electrical connections is mitigated. Moreover, arcing within the process chamber 100 is reduced.

The RF cable 117 is also coupled to an electrostatic chuck (ESC) feedthrough box 125. A high voltage direct current (HV DC) power supply 126 inputs power to the ESC feedthrough box 125 to facilitate operation of an electrostatic chuck (not shown) located within the pedestal 110. The ESC feedthrough box 125 facilitates conduction of HV DC current through the RF cable 117, through the RF filter 114, and to the pedestal 110 and the electrode 113.

The ESC feedthrough box 125 includes a capacitor 136 and an inductor 134 disposed in series between the HV DC power supply 126 and the RF cable 117. The ESC feedthrough box 125 is greatly simplified compared to conventional approaches, for example, omitting variable capacitors (e.g., conventionally called a "bottom tuner"). The feedthrough box 125 is coupled to ground.

Figure 2:
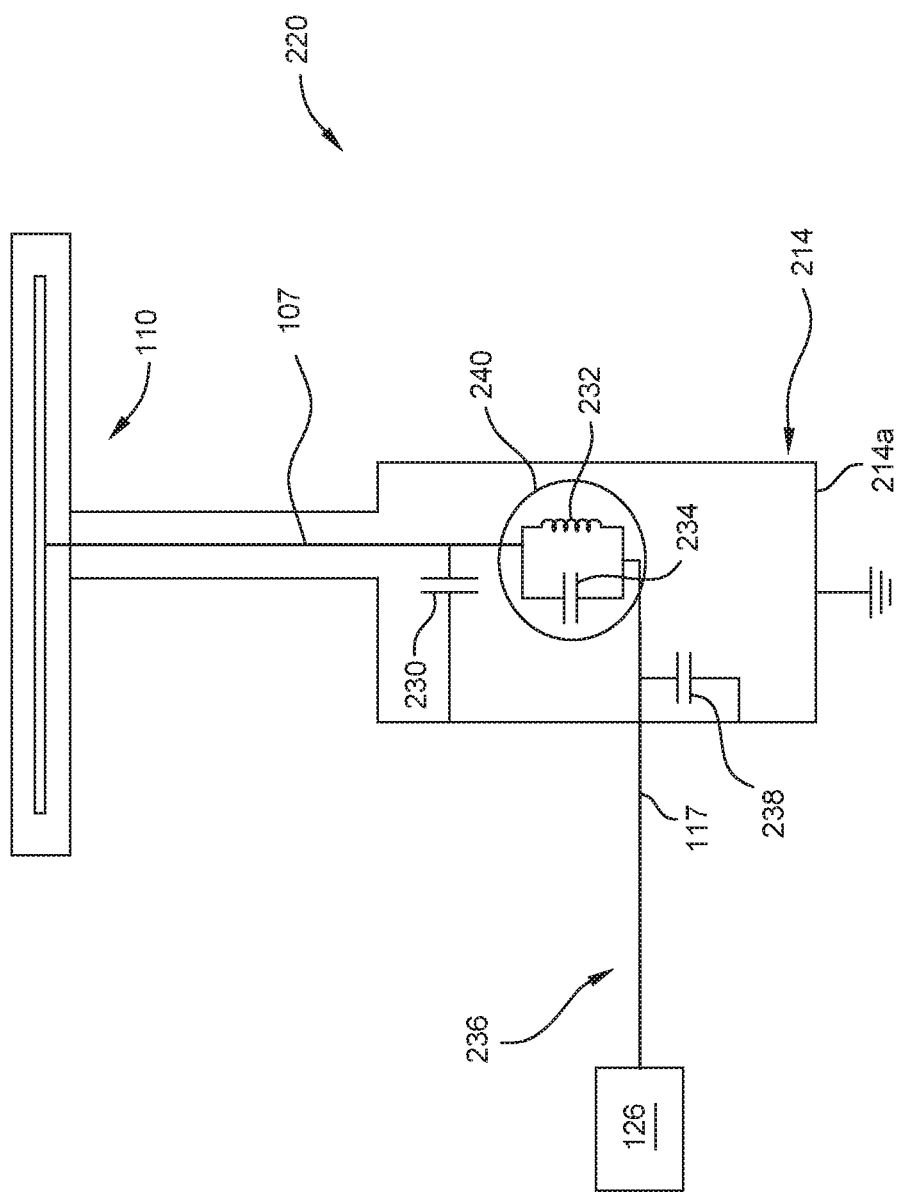
FIG. 2 illustrates a pedestal and RF grounding configuration, according to one aspect of the disclosure.

FIG. 2 illustrates a pedestal 110 and an RF grounding configuration 220 coupled thereto, according to one aspect of the disclosure. The RF grounding configuration 220 may be used in place of the RF grounding configuration 120 shown in FIG. 1. The RF grounding configuration 220 includes an RF filter 214. The RF filter 214 includes a capacitor 230 disposed in series with an LC resonant circuit 240. The LC resonant circuit 240 includes a capacitor 234 and an inductor 232 disposed in parallel with one another. An ESC cable 236 conducts HV DC power from the HV DC power supply 126 through the RF cable 117 to the pedestal 110. A capacitor 238 couples the RF cable 117 to an electrically-conductive housing 214a of the RF filter 214.

In the example of FIG. 2, RF power, for example at a frequency of 13.56 MHz, is coupled through a plasma in a process chamber (such as the process chamber 100) to an RF mesh or another electrode within the pedestal 110. The RF mesh or other electrode is connected to ground through an RF rod 107 via the capacitor 230. A capacitance of the capacitor 230 is selected such that the capacitor 230 provides a virtual ground to 13.56 MHz RF current. Also, the capacitor 230 is chosen such that a heater-to-ground impedance matches a known a value. The LC resonant circuit 240 facilitates blocking of any residual RF current flowing through the RF cable 117. The LC resonant circuit 240 provides a higher impedance than the first inductor 132 when compared to the RF grounding configuration 120, shown in FIG. 1. The capacitor 238 facilitates grounding of the RF voltage across the RF cable 117 such that the voltage (and thus the current) across the RF cable 117 is zero or nearly zero. In one example, the RF voltage is less than 10 V (rms). In one example, RF current at 13.56 MHz, measured through a sensor at the output of the RF filter 214, is around 0.5 A (rms).

Figure 3:
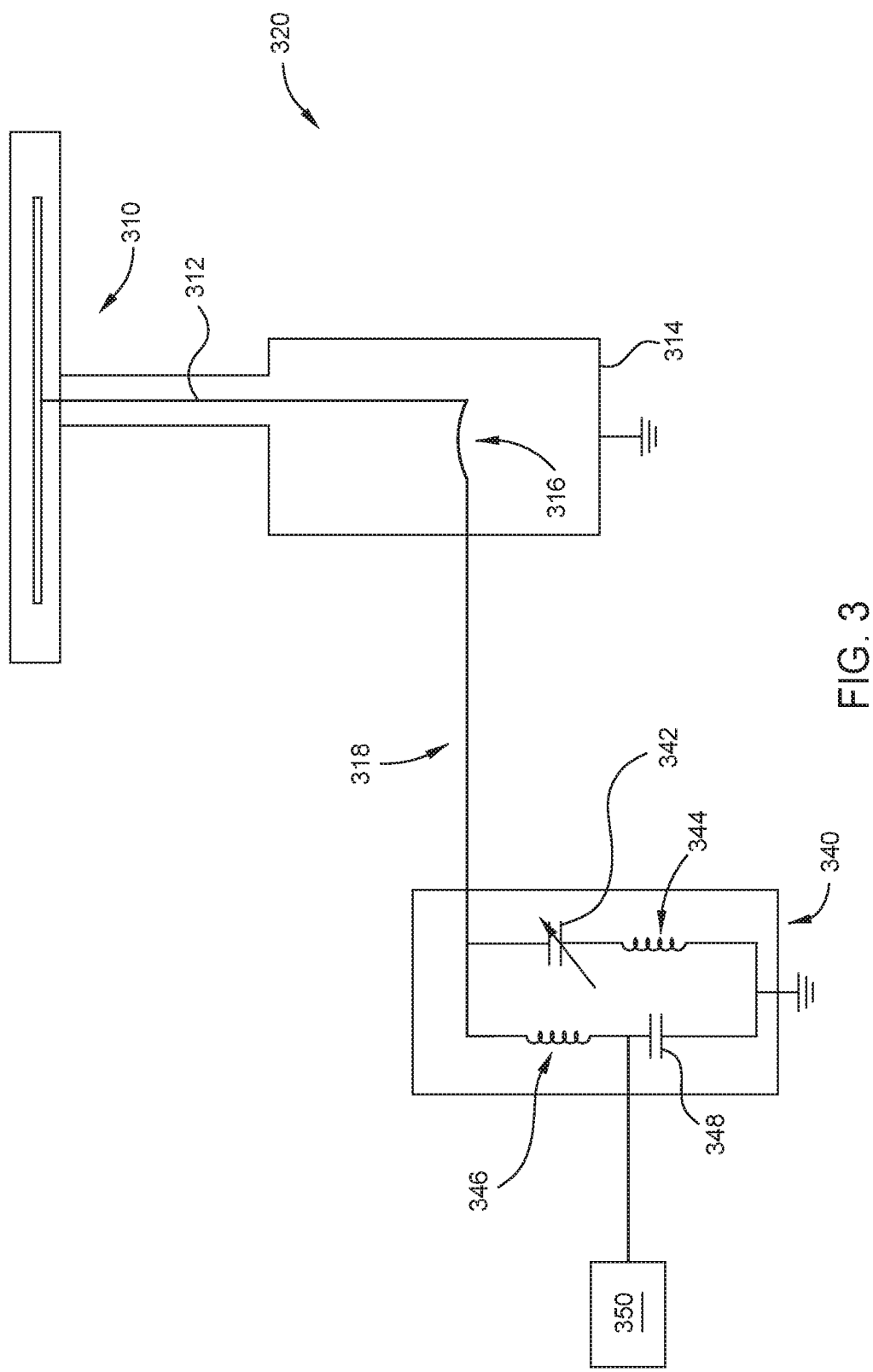
FIG. 3 illustrates a conventional RF grounding configuration utilizing a bottom tuner.

FIG. 3 illustrates a conventional RF grounding configuration 320. The conventional RF grounding configuration 320 is coupled to a pedestal 310. The pedestal may be disposed in a process chamber, such as the process chamber 100 described with respect to FIG. 1. The RF grounding configuration 320 includes an RF filter 314 and a bottom tuner 340. An RF rod 312 extends through a shaft of the pedestal 310 to the RF filter 314. The RF filter 314 includes an RF strap 316 therein, which couples the RF rod 312 to an RF cable 318. The RF cable 318 is connected to the bottom tuner 340. The bottom tuner 340 includes a variable capacitor 342 and an inductor 344, which are disposed in parallel to a fixed capacitor 348 and an inductor 346. In the conventional RF grounding configuration 320, all the RF current conducted from the pedestal 310 is grounded to a body of the process chamber through the bottom tuner 340, which is in turn connected to an RF power generator ground. In such a configuration, RF current at 13.56 MHz inside the bottom tuner 340 is around 25 A (rms), which results in issues previously discussed.

While the foregoing is directed to embodiments of the present disclosure, other and further embodiments of the disclosure may be devised without departing from the basic scope thereof, and the scope thereof is determined by the claims that follow.

What is claimed is:
1. An apparatus, comprising:
   a chamber body at least partially defining a process volume therein;
   a pedestal disposed in the process volume, the pedestal comprising a substrate support and a shaft coupled to the substrate support;

a first electrode disposed in the process volume opposite the pedestal;
a second electrode disposed in the pedestal;
a conductive rod extending through the shaft of the pedestal, the conductive rod coupled to the second electrode;
an RF filter disposed in an enclosure and coupled to the conductive rod, the enclosure coupled to ground and the conductive rod extending through a top of the enclosure, and the RF filter comprising:
a first capacitor coupled to the conductive rod and coupled to the enclosure; and
a first inductor coupled to the conductive rod;
a feedthrough box coupled to ground, the feedthrough box comprising a second inductor and a second capacitor coupled in series;
an RF cable extending at least partially between the enclosure and the feedthrough box, the RF cable disposed in series with the second inductor and the RF filter; and
a power supply coupled to the second electrode through the second inductor and the RF filter, the power supply coupled between the second inductor and the second capacitor.

2. The apparatus of claim 1, wherein the first capacitor creates a ground path for RF power from the second electrode.

3. The apparatus of claim 1, further comprising:
an RF source coupled to the first electrode.

4. The apparatus of claim 3, wherein RF power from the RF source to the first electrode has a frequency of 13.56 MHz.

5. The apparatus of claim 1, wherein the second capacitor is coupled to the feedthrough box.

6. The apparatus of claim 1, wherein the enclosure of the RF filter extends at least partially through the chamber body.

7. The apparatus of claim 6, wherein the conductive rod extends from the second electrode.

8. The apparatus of claim 6, wherein the power supply is coupled to a location between the second capacitor and the second inductor.

9. The apparatus of claim 6, wherein the second capacitor is configured to be coupled to ground.

10. The apparatus of claim 1, wherein the enclosure surrounds the first capacitor and the first inductor.

11. The apparatus of claim 1, wherein the conductive rod extends from the second electrode.

12. The apparatus of claim 1, wherein the power supply is coupled to a location between the second capacitor and the second inductor.

13. An apparatus for processing a substrate, comprising:
a pedestal comprising a substrate support and a shaft;
an electrode disposed in the pedestal;
a conductive rod coupled to the electrode;
an RF filter coupled to the conductive rod, the RF filter comprising:
an electrically conductive housing coupled to ground, the conductive rod extending through the shaft and through a top of the electrically conductive housing,
a first capacitor coupled between the conductive rod and the electrically conductive housing, and
a first inductor coupled to the conductive rod;
a feedthrough box coupled to ground, the feedthrough box having a second inductor and a second capacitor coupled in series disposed therein, the second capacitor coupled between the second inductor and the feedthrough box;
an RF cable extending at least partially between the electrically conductive housing and the feedthrough box, the RF cable disposed in series with the RF filter and the second inductor of the feedthrough box; and
a power supply coupled to the electrode through the second inductor and the RF filter.

14. The apparatus of claim 13, wherein the electrically conductive housing of the RF filter extends at least partially through a chamber body that at least partially defines a process volume of the apparatus.

15. The apparatus of claim 13, wherein the electrically conductive housing surrounds the first capacitor and the first inductor.

16. The apparatus of claim 13, wherein the first capacitor creates a ground path for RF power from the electrode.

17. The apparatus of claim 13, further comprising:
a second electrode; and
an RF source coupled to the second electrode.

18. The apparatus of claim 17, wherein RF power from the RF source to the second electrode has a frequency of 13.56 MHz.

19. The apparatus of claim 13, wherein the second capacitor is coupled to the feedthrough box.

* * * * *